United States Patent
Singh et al.

(10) Patent No.: US 8,912,077 B2
(45) Date of Patent: Dec. 16, 2014

(54) HYBRID LASER AND PLASMA ETCH WAFER DICING USING SUBSTRATE CARRIER

(75) Inventors: Saravjeet Singh, Santa Clara, CA (US); Brad Eaton, Menlo Park, CA (US); Ajay Kumar, Cupertino, CA (US); Wei-Sheng Lei, San Jose, CA (US); James M. Holden, San Jose, CA (US); Madhava Rao Yalamanchili, Morgan Hill, CA (US); Todd J. Egan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 260 days.

(21) Appl. No.: 13/161,052

(22) Filed: Jun. 15, 2011

(65) Prior Publication Data

US 2012/0322239 A1 Dec. 20, 2012

(51) Int. Cl.
*H01L 21/00* (2006.01)

(52) U.S. Cl.
USPC .............. 438/462; 438/460; 257/E21.602; 156/345.35

(58) Field of Classification Search
CPC ............... H01L 21/3065; H01L 21/67069
USPC .......................... 438/460, 462–464
See application file for complete search history.

(56) References Cited

U.S. PATENT DOCUMENTS

| | | |
|---|---|---|
| 4,049,944 A | 9/1977 | Garvin et al. |
| 5,593,606 A | 1/1997 | Owen et al. |
| 6,057,180 A | 5/2000 | Sun et al. |
| 6,174,271 B1 | 1/2001 | Kosmowski |
| 6,306,731 B1 | 10/2001 | Igarashi et al. |
| 6,407,363 B2 | 6/2002 | Dunsky et al. |
| 6,426,275 B1 * | 7/2002 | Arisa ............................ 438/464 |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V.,, et al., "Water-Soluble Sacrificial Layers for Surface Micromachining," www.small-journal.com, 2005, 1, No. 7, 7 pgs.

(Continued)

*Primary Examiner* — Leonard Chang
(74) *Attorney, Agent, or Firm* — Blakely Sokoloff Taylor Zafman LLP

(57) ABSTRACT

Methods of dicing semiconductor wafers, each wafer having a plurality of integrated circuits, are described. A method includes forming a mask above the semiconductor wafer, the mask composed of a layer covering and protecting the integrated circuits. The semiconductor wafer is supported by a substrate carrier. The mask is then patterned with a laser scribing process to provide a patterned mask with gaps, exposing regions of the semiconductor wafer between the integrated circuits. The semiconductor wafer is then etched through the gaps in the patterned mask to singulate the integrated circuits while supported by the substrate carrier.

19 Claims, 20 Drawing Sheets

(56) References Cited

U.S. PATENT DOCUMENTS

| | | |
|---|---|---|
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 * | 3/2011 | Arita et al. .................... 438/462 |
| 7,923,351 B2 | 4/2011 | Arita |
| 7,927,973 B2 | 4/2011 | Haji et al. |
| 2002/0121345 A1 | 9/2002 | Chen et al. |
| 2003/0045101 A1 | 3/2003 | Flanner et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2006/0043535 A1 | 3/2006 | Hiatt |
| 2006/0088984 A1 * | 4/2006 | Li et al. ........................ 438/463 |
| 2006/0205182 A1 | 9/2006 | Soejima |
| 2009/0255911 A1 | 10/2009 | Krishnaswami et al. |
| 2012/0238073 A1 | 9/2012 | Johnson et al. |
| 2013/0065378 A1 | 3/2013 | Johnson et al. |
| 2013/0230968 A1 | 9/2013 | Johnson et al. |
| 2013/0230969 A1 | 9/2013 | Martinez et al. |
| 2013/0230970 A1 | 9/2013 | Martinez et al. |
| 2013/0230971 A1 | 9/2013 | Geerpuram et al. |
| 2013/0230972 A1 | 9/2013 | Johnson et al. |
| 2013/0230973 A1 | 9/2013 | Gauldin et al. |
| 2013/0230974 A1 | 9/2013 | Martinez et al. |
| 2013/0344683 A1 | 12/2013 | Lazerand et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007-281526 | 10/2007 |
| WO | WO-03036712 | 5/2003 |
| WO | WO-03071591 | 5/2003 |
| WO | 2012/125560 | 9/2012 |

OTHER PUBLICATIONS

Singh, Saravjeet, et al., "Apparatus and Methods for Dry Etch With Edge, Side and Back Protection," U.S. Appl. No. 61/491,693, filed May 31, 2011. 24 pgs.

International Search Report and Written Opinion from PCT Patent Application No. PCT/US2012/040289 mailed Jan. 2, 2013, 11 pgs.

International Preliminary Report on Patentability from PCT/US2012/040289 mailed Jan. 3, 2014, 8 pgs.

Johnson, et al., U.S. Appl. No. 61/452,450, filed on Mar. 14, 2011, 36 pgs.

* cited by examiner

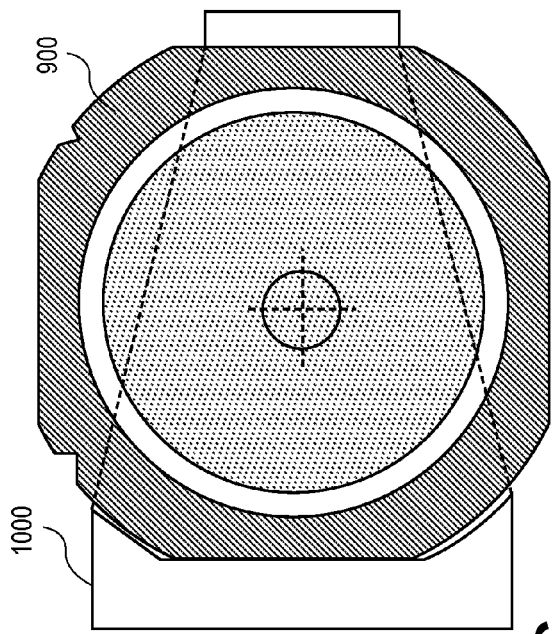
FIG. 10C
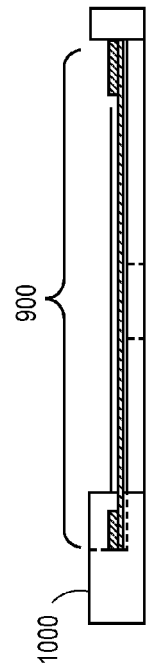
FIG. 10D
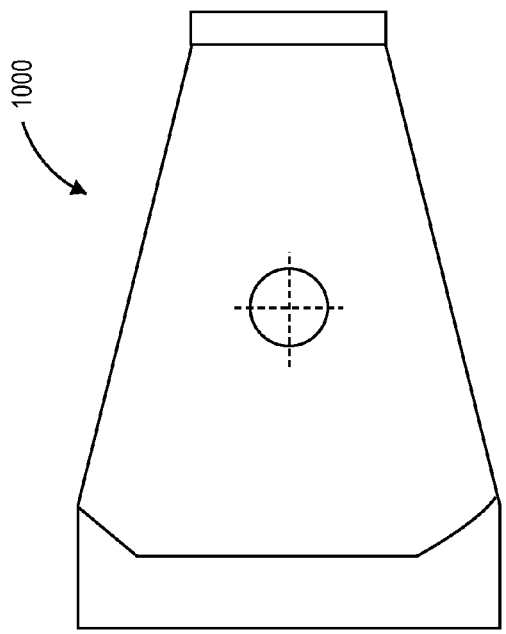

HYBRID LASER AND PLASMA ETCH WAFER DICING USING SUBSTRATE CARRIER

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes forming a mask above the semiconductor wafer, the mask composed of a layer covering and protecting the integrated circuits. The semiconductor wafer is supported by a substrate carrier. The mask is then patterned with a laser scribing process to provide a patterned mask with gaps, exposing regions of the semiconductor wafer between the integrated circuits. The semiconductor wafer is then etched through the gaps in the patterned mask to singulate the integrated circuits while supported by the substrate carrier.

In an embodiment, an etch reactor includes a chamber, an inductively coupled plasma (ICP) source positioned above the chamber, and an end effector for transferring a substrate carrier to and from the chamber.

In an embodiment, a system for dicing a semiconductor wafer including a plurality of integrated circuits includes a factory interface, and a laser scribe apparatus coupled with the factory interface and housing a laser. The system also includes a plasma etch reactor coupled with the factory interface. The plasma etch reactor includes a chamber and an end effector for transferring a substrate carrier to and from the chamber.

BRIEF DESCRIPTION OF THE DRAWINGS

FIGS. 10C and 10D illustrate a plan view and a side-view, respectively, of an end effector (left side) supporting a substrate carrier (right side), in accordance with an embodiment of the present invention.

DETAILED DESCRIPTION

Figure 1:
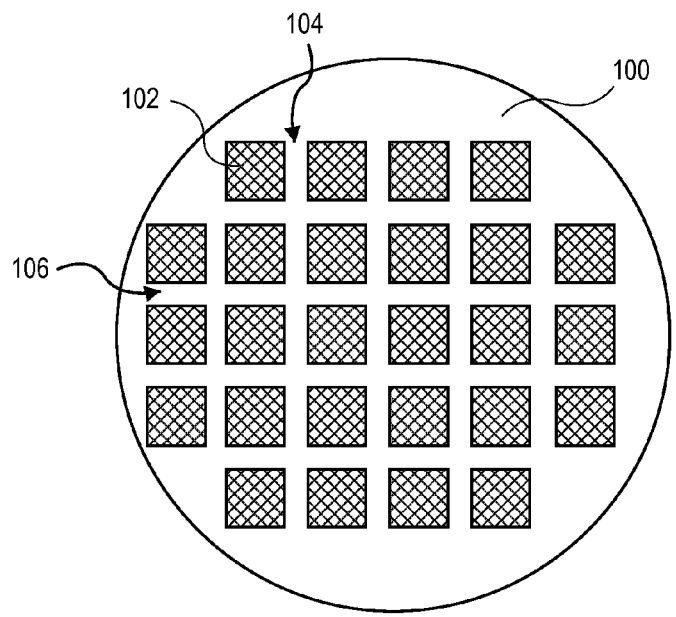
FIG. 1 illustrates a top plan of a semiconductor wafer to be diced, in accordance with an embodiment of the present invention.

Methods of dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. The wafer or substrate may be a thin wafer or substrate, e.g., with a thickness of approximately 100 microns or less, and may be supported by a substrate carrier during the singulation process.

In accordance with an embodiment of the present invention, described herein is an apparatus and method to transfer, support and protect a substrate carrier composed of thin wafer tape and a tape frame during plasma etch in a singulation process. For example, an apparatus may be used to support and protect the film and film frame used to hold a thin silicon wafer from etch gases. The manufacturing processes related to integrated circuit (IC) packaging may require that a thinned silicon wafer be supported and mounted on a film such as a die attach film. In one embodiment, a die attach film is also supported by a substrate carrier and is used to adhere a thin silicon wafer to the substrate carrier.

Conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
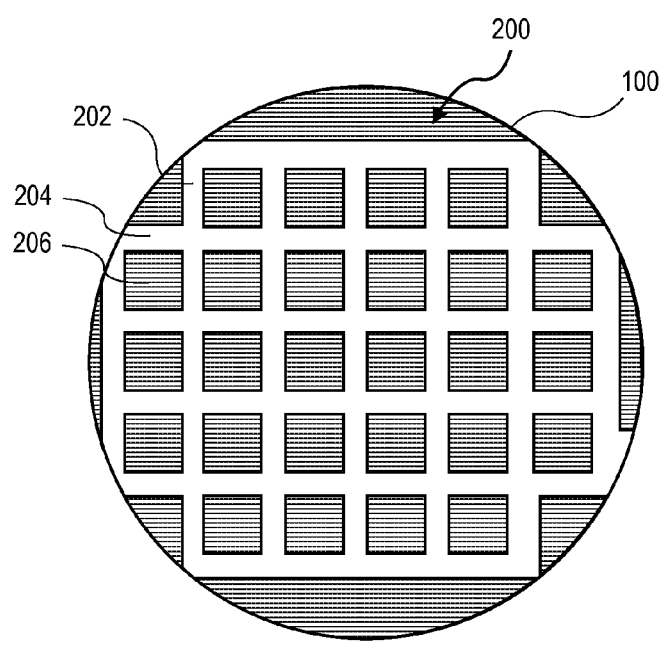
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100.

Figure 3:
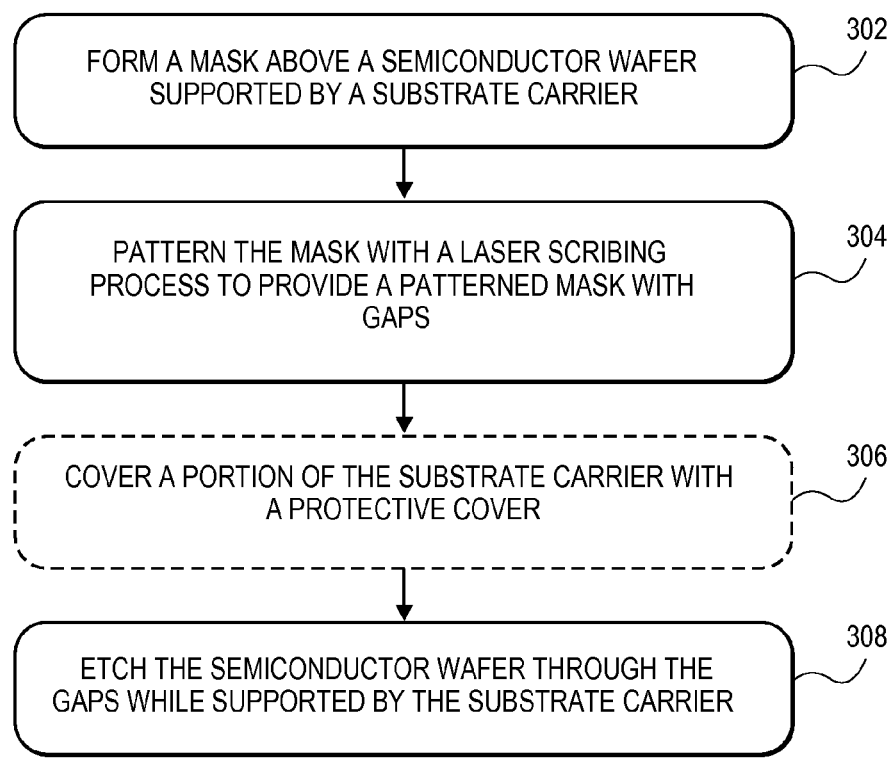
FIG. 3 is a Flowchart representing operations in a method of dicing a semiconductor wafer including a plurality of integrated circuits, in accordance with an embodiment of the present invention.
Figure 4A:
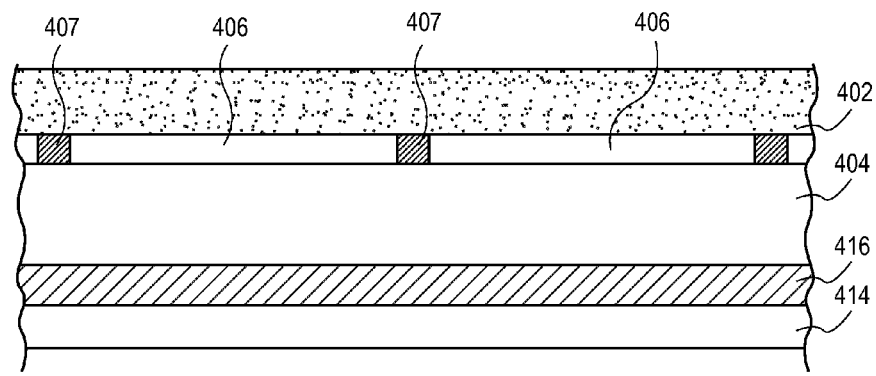
FIG. 4A illustrates a cross-sectional view of a semiconductor wafer including a plurality of integrated circuits during performing of a method of dicing the semiconductor wafer, corresponding to operation 302 of the Flowchart of FIG. 3, in accordance with an embodiment of the present invention.
Figure 4B:
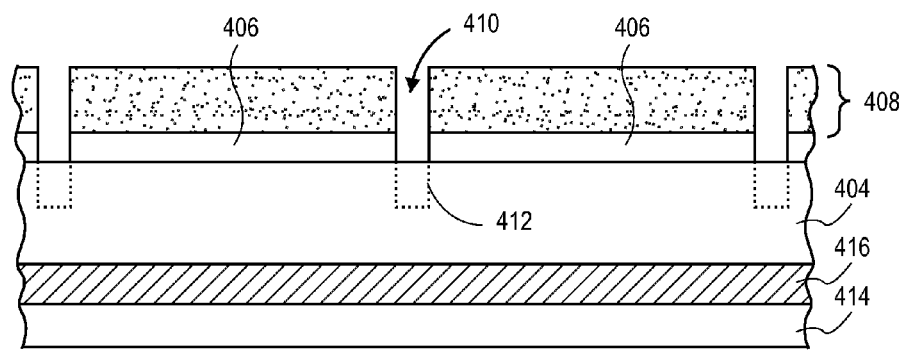
FIG. 4B illustrates a cross-sectional view of a semiconductor wafer including a plurality of integrated circuits during performing of a method of dicing the semiconductor wafer, corresponding to operation 304 of the Flowchart of FIG. 3, in accordance with an embodiment of the present invention.
Figure 4C:
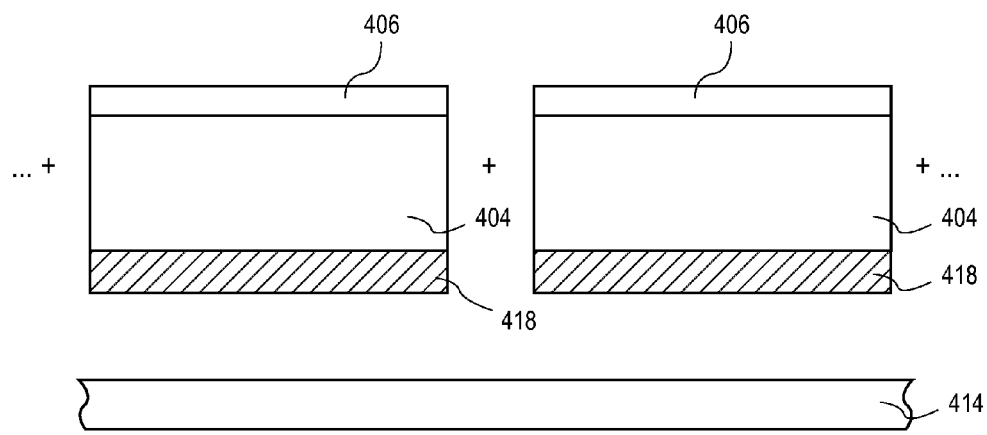
FIG. 4C illustrates a cross-sectional view of a semiconductor wafer including a plurality of integrated circuits during performing of a method of dicing the semiconductor wafer, corresponding to operation 308 of the Flowchart of FIG. 3, in accordance with an embodiment of the present invention.

FIG. 3 is a Flowchart 300 representing operations in a method of dicing a semiconductor wafer including a plurality of integrated circuits, in accordance with an embodiment of the present invention. FIGS. 4A-4C illustrate cross-sectional views of a semiconductor wafer including a plurality of integrated circuits during performing of a method of dicing the semiconductor wafer, corresponding to operations of Flowchart 300, in accordance with an embodiment of the present invention.

Referring to operation 302 of Flowchart 300, and corresponding FIG. 4A, a mask 402 is formed above a semiconductor wafer or substrate 404. The mask 402 is composed of a layer covering and protecting integrated circuits 406 formed on the surface of semiconductor wafer 404. The mask 402 also covers intervening streets 407 formed between each of the integrated circuits 406. The semiconductor wafer or substrate 404 is supported by a substrate carrier 414.

In an embodiment, the substrate carrier 414 includes a layer of backing tape, a portion of which is depicted as 414 in FIG. 4A, surrounded by a tape ring. In one such embodiment, the semiconductor wafer or substrate 404 is disposed on a die attach film 416 disposed on the substrate carrier 414, as depicted in FIG. 4A.

In accordance with an embodiment of the present invention, forming the mask 402 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 404 is composed of a material suitable to withstand a fabrication process and upon which semiconductor processing layers may suitably be disposed. For example, in one embodiment, semiconductor wafer or substrate 404 is composed of a group IV-based material such as, but not limited to, crystalline silicon, germanium or silicon/germanium. In a specific embodiment, providing semiconductor wafer 404 includes providing a monocrystalline silicon substrate. In a particular embodiment, the monocrystalline silicon substrate is doped with impurity atoms. In another embodiment, semiconductor wafer or substrate 404 is composed of a material such as, e.g., a material substrate used in the fabrication of light emitting diodes (LEDs).

In an embodiment, the semiconductor wafer or substrate 404 has a thickness of approximately 100 microns or less. For example, in one embodiment, a bulk single-crystalline silicon substrate is thinned from the backside prior to being affixed to the die attach film 416. The thinning may be performed by a backside grind process. In one embodiment, the bulk single-crystalline silicon substrate is thinned to a thickness approximately in the range of 50-100 microns. It is important to note that, in an embodiment, the thinning is performed prior to a laser ablation and plasma etch dicing process. In an embodiment, the die attach film 416 (or any suitable substitute capable of bonding a thinned or thin wafer or substrate to the substrate carrier 414) has a thickness of approximately 20 microns.

In an embodiment, semiconductor wafer or substrate 404 has disposed thereon or therein, as a portion of the integrated circuits 406, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 406. Materials making up the streets 407 may be similar to or the same as those materials used to form the integrated circuits 406. For example, streets 407 may be composed of layers of dielectric materials, semiconductor materials, and metallization. In one embodiment, one or more of the streets 407 includes test devices similar to the actual devices of the integrated circuits 406.

Referring to operation 304 of Flowchart 300, and corresponding FIG. 4B, the mask 402 is patterned with a laser scribing process to provide a patterned mask 408 with gaps 410, exposing regions of the semiconductor wafer or substrate 404 between the integrated circuits 406. In one such embodiment, the laser scribing process is a femtosecond-based laser scribing process. As such, the laser scribing process is used to remove the material of the streets 407 originally formed between the integrated circuits 406. In accordance with an embodiment of the present invention, patterning the mask 402 with the laser scribing process includes forming trenches 412 partially into the regions of the semiconductor wafer 404 between the integrated circuits 406, as depicted in FIG. 4B.

In an embodiment, patterning the mask 406 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 402, the streets 407 and, possibly, a portion of the semiconductor wafer or substrate 404.

Figure 5:
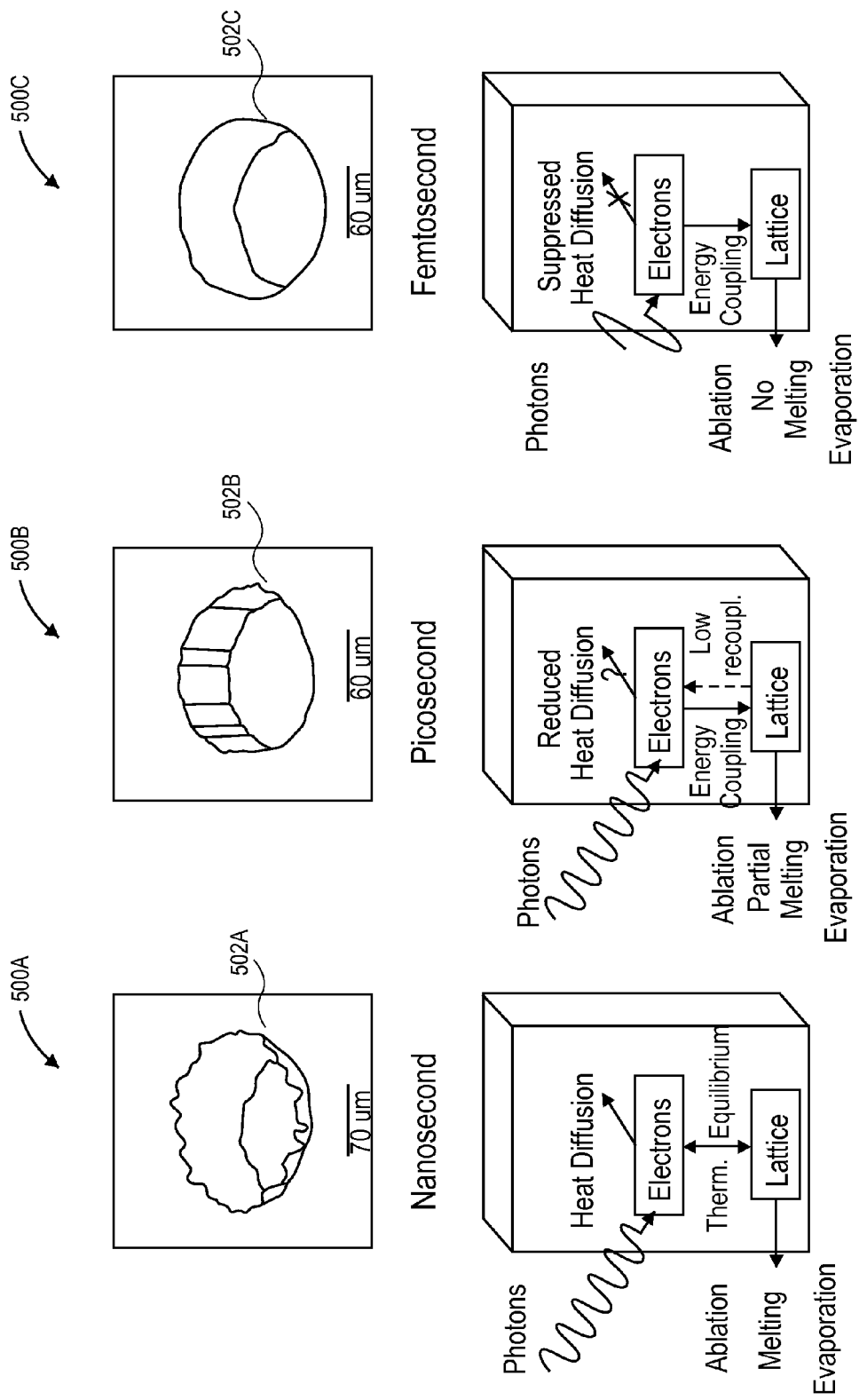
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spatial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to optional operation 306 of Flowchart 300, in accordance with an embodiment of the present invention, a portion of the substrate carrier is covered with a protective plate. Such a protective plate is described in more detail below in association with FIGS. 13A-13D. In one embodiment, the protective plate leaves exposed at least a portion of the semiconductor wafer or substrate 404, also described in greater detail in association with FIGS. 13A-13D below. In a specific embodiment, the protective plate is implemented subsequent to a laser scribe process but prior to a plasma etch process, as depicted in Flowchart 300. However, in another specific embodiment, the protective plate is implemented prior to both a laser scribe process and a plasma etch process.

Referring to operation 308 of Flowchart 300, and corresponding FIG. 4C, the semiconductor wafer or substrate 404 is etched through the gaps 410 in the patterned mask 408 to singulate the integrated circuits 406. In accordance with an embodiment of the present invention, etching the semiconductor wafer 404 includes etching the trenches 412 formed with the laser scribing process to ultimately etch entirely through semiconductor wafer or substrate 404, as depicted in FIG. 4C.

In an embodiment, etching the semiconductor wafer or substrate 404 includes using a plasma etching process. In one embodiment, a through-silicon via type etch process is used. For example, in a specific embodiment, the etch rate of the material of semiconductor wafer or substrate 404 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In an embodiment, singulation may further include patterning of die attach film 416. In one embodiment, die attach film 416 is patterned by a technique such as, but not limited to, laser ablation, dry etching or wet etching. In an embodiment, the die attach film 416 is patterned in sequence following the laser scribe and plasma etch portions of the singulation process to provide die attach film portions 418, as depicted in FIG. 4C. In an embodiment, the patterned mask 408 is removed after the laser scribe and plasma etch portions of the singulation process, as is also depicted in FIG. 4C. The patterned mask 408 may be removed prior to, during, or following patterning of the die attach film 416. In an embodiment, the semiconductor wafer or substrate 404 is etched while supported by the substrate carrier 414. In an embodiment, the die attach film 416 is also patterned while disposed on the substrate carrier 414.

Accordingly, referring again to Flowchart 100 and FIGS. 2A-2C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. Furthermore, removal of exposed portions of the die attach film is performed to provide singulated integrated circuits, each having a portion of a die attach film thereon. The individual integrated circuits, including die attach film portions may then be removed from the substrate carrier 414, as depicted in FIG. 4C. In an embodiment, the singulated integrated circuits are removed from the substrate carrier 414 for packaging. In one such embodiment, the patterned die attach film 418 is retained on the backside of each integrated circuit and included in the final packaging. However, in another embodiment, the patterned die attach film 414 is removed during or subsequent to the singulation process.

Referring again to FIGS. 4A-4C, the plurality of integrated circuits 406 may be separated by streets 407 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 6 illustrates compaction on a semiconductor wafer or substrate achieved by using narrower streets versus conventional dicing which may be limited to a minimum width, in accordance with an embodiment of the present invention.

Figure 6:
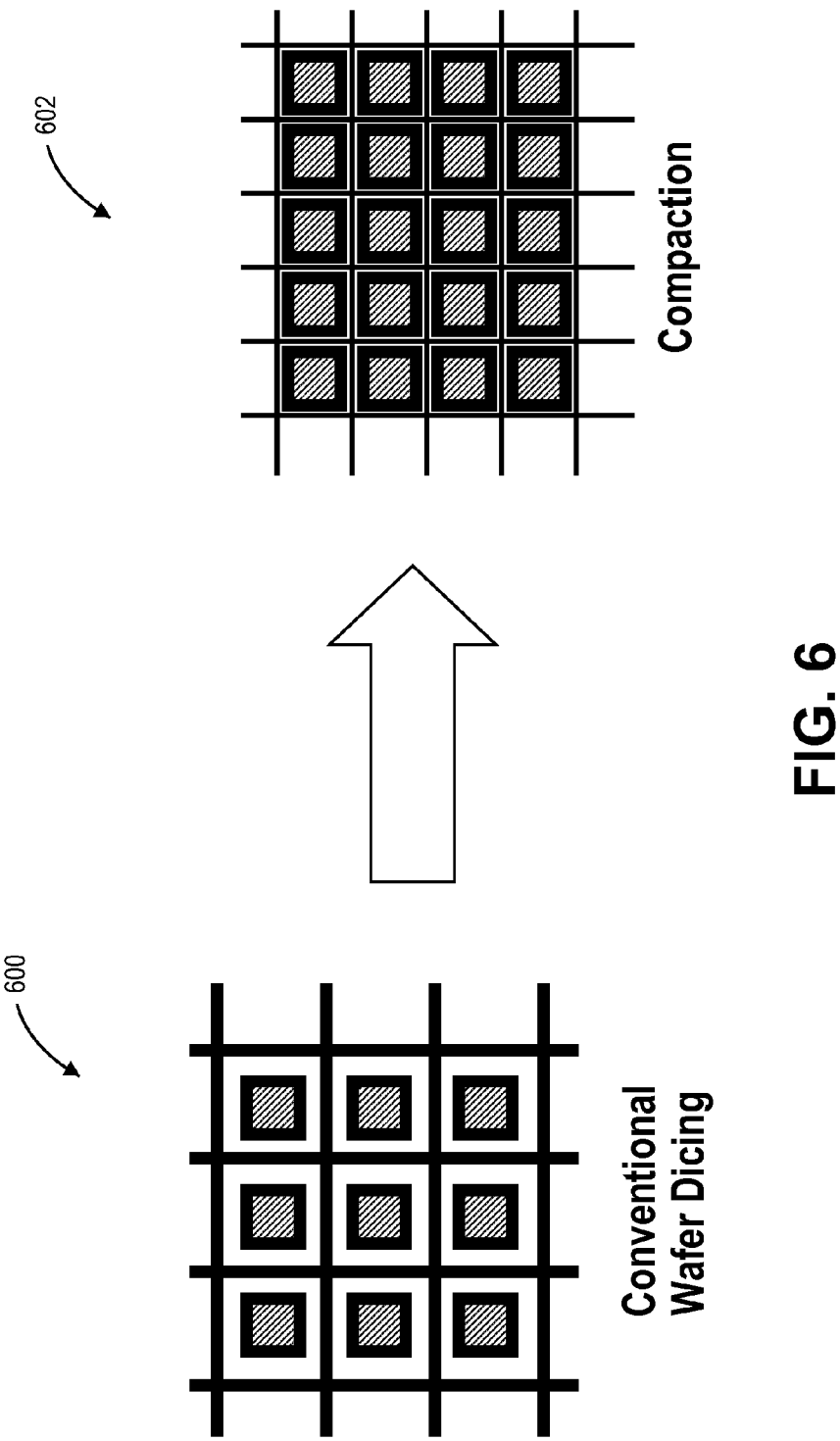
FIG. 6 illustrates compaction on a semiconductor wafer achieved by using narrower streets versus conventional dicing which may be limited to a minimum width, in accordance with an embodiment of the present invention.

Referring to FIG. 6, compaction on a semiconductor wafer is achieved by using narrower streets (e.g., widths of approximately 10 microns or smaller in layout 602) versus conventional dicing which may be limited to a minimum width (e.g., widths of approximately 70 microns or larger in layout 600). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 7:
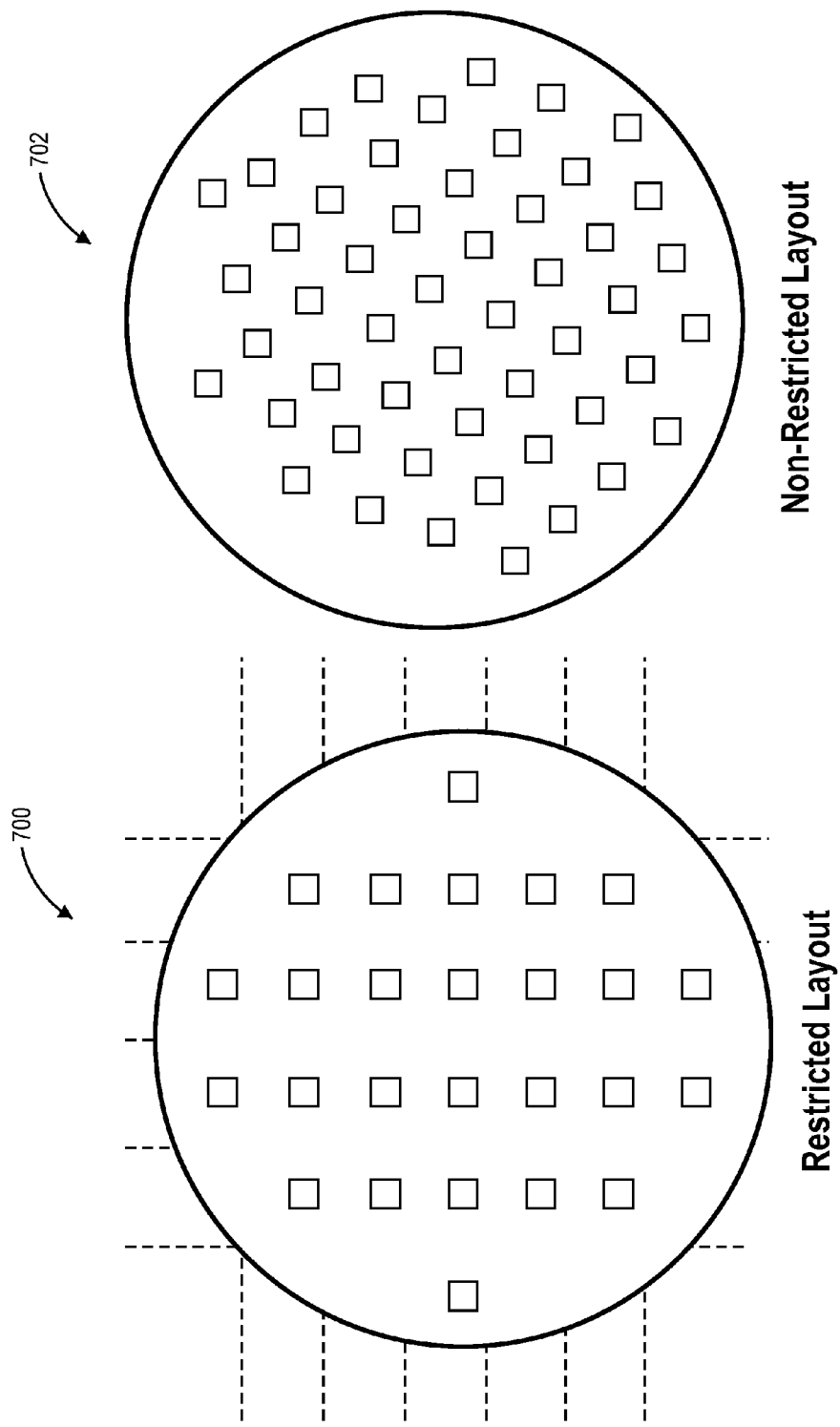
FIG. 7 illustrates freeform integrated circuit arrangement allowing denser packing and, hence, more die per wafer versus grid alignment approaches, in accordance with an embodiment of the present invention.

Referring again to FIGS. 4A-4C, the plurality of integrated circuits 406 may be arranged on semiconductor wafer or substrate 404 in a non-restricted layout. For example, FIG. 7 illustrates a freeform integrated circuit arrangement allowing denser packing. The denser packing may provide for more die per wafer versus grid alignment approaches, in accordance with an embodiment of the present invention. Referring to FIG. 7, a freeform layout (e.g., a non-restricted layout on semiconductor wafer or substrate 702) allows denser packing and hence more die per wafer versus grid alignment approaches (e.g., a restricted layout on semiconductor wafer or substrate 700). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 8 illustrates a block diagram of a tool layout for laser and plasma dicing of wafers or substrates, in accordance with an embodiment of the present invention.

Figure 8:
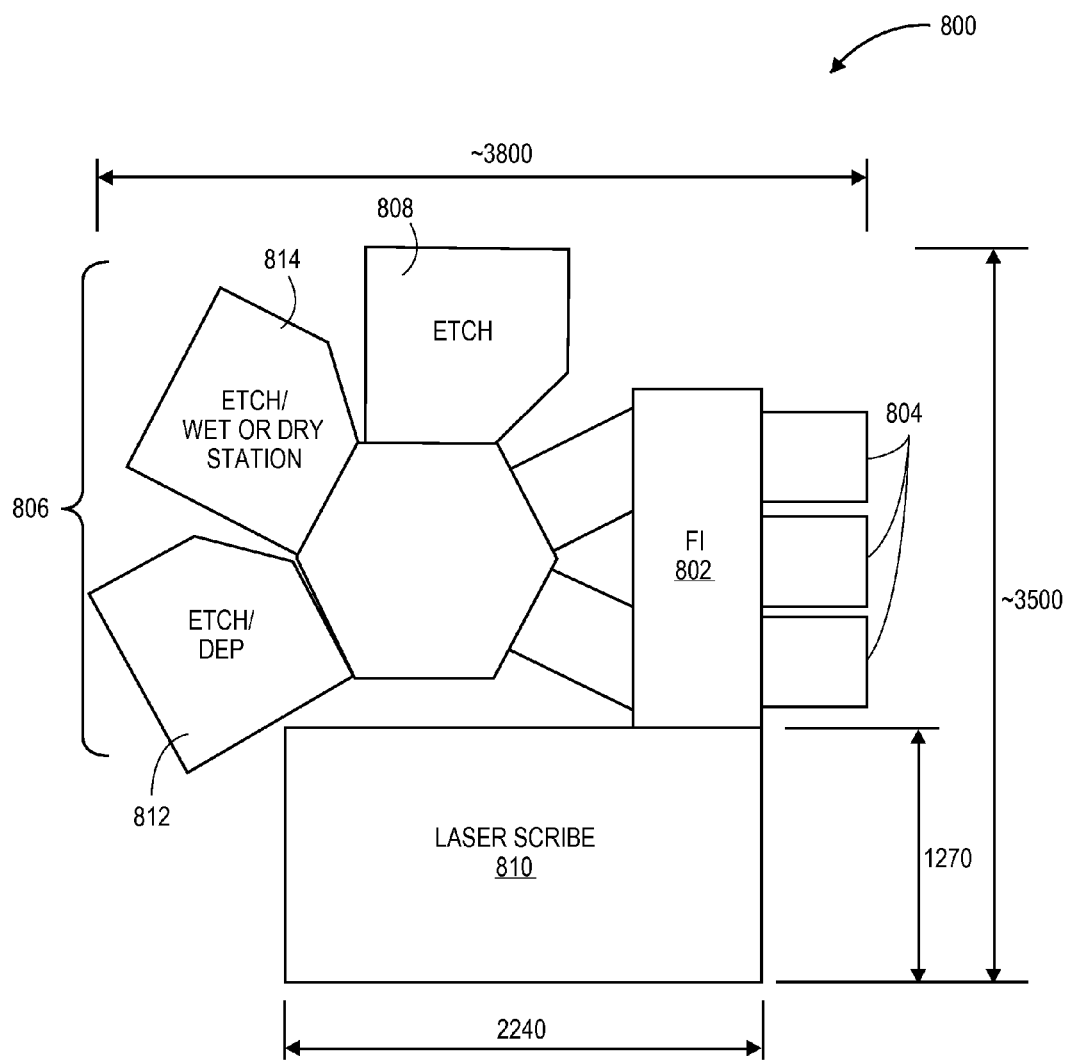
FIG. 8 illustrates a block diagram of a tool layout for laser and plasma dicing of wafers or substrates, in accordance with an embodiment of the present invention.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 800, the moveable stage configured for moving a wafer or substrate (or a carrier thereof) relative to the femtosecond-based laser. In a specific embodiment, the femtosecond-based laser is also moveable. The overall footprint of the laser scribe apparatus 810 may be, in one embodiment, approximately 2240 millimeters by approximately 1270 millimeters, as depicted in FIG. 8.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a photoresist layer. In another embodiment, in place of an additional etch chamber, a wet/dry station 814 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 800.

In an aspect of the present invention, a thin substrate (e.g., with a thickness of approximately 100 microns or less) is accommodated in a hybrid laser ablation and plasma etching singulation process. In one such embodiment, the thin substrate is supported on a substrate carrier. For example, FIG. 9 illustrates a plan view of a substrate carrier suitable for supporting a thin wafer during a singulation process, in accordance with an embodiment of the present invention.

Figure 9:
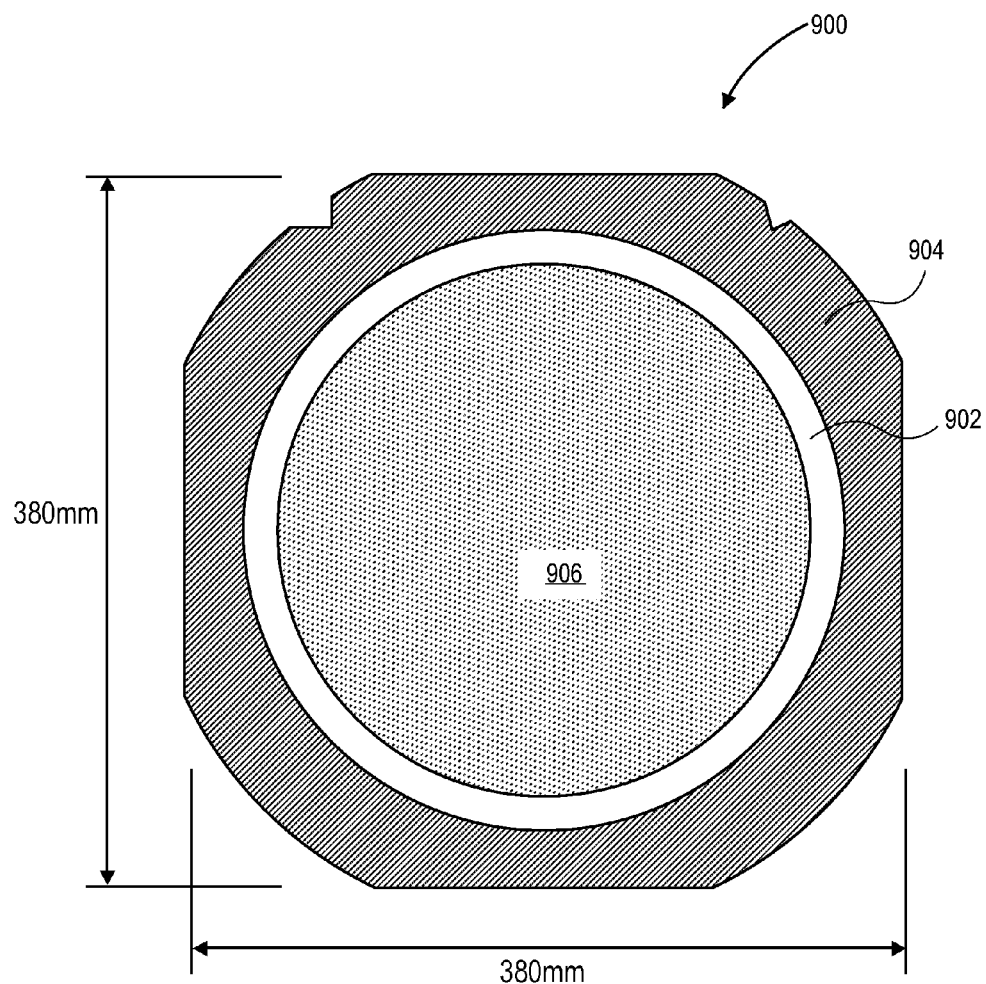
FIG. 9 illustrates a plan view of a substrate carrier suitable for supporting a thin wafer during a singulation process, in accordance with an embodiment of the present invention.

Referring to FIG. 9, a substrate carrier 900 includes a layer of backing tape 902 surrounded by a tape ring 904. A wafer or substrate 906, such as a thin wafer or substrate, is supported by the backing tape 902 of the substrate carrier 900. In one embodiment, the wafer or substrate 906 is attached to the backing tape 902 by a die attach film. In one embodiment, the tape ring 904 is composed of stainless steel.

In an embodiment, a singulation process can be accommodated in a system sized to receive a substrate carrier such as the substrate carrier 900. In one such embodiment, a system such as system 800 can accommodate a thin wafer frame without impact on the system footprint that is otherwise sized to accommodate a substrate or wafer not supported by a substrate carrier. In one embodiment, system 800 is sized to accommodate 300 millimeter-in-diameter wafers or substrates. The same system can accommodate a wafer carrier approximately 380 millimeters in width by 380 millimeters in length, as depicted in FIG. 9.

In an aspect of the present invention, a substrate carrier is accommodated in an etch chamber during a singulation process. In an embodiment, the assembly including a thin wafer or substrate on the substrate carrier is subjected to a plasma etch reactor without affecting (e.g., etching) the film frame (e.g., tape ring 904) and the film (e.g., backing tape 902). Furthermore, aspects of the invention address transfer and support a wafer or substrate supported by a combination film and film frame (substrate carrier) during the etch process. Embodiments of the present invention may include the use of a robotic end effector, a capture ring, or a protective plate, example of which are described below.

An end effector may be used to accommodate a substrate carrier during an etch portion of a singulation process. For example, FIGS. 10A and 10B illustrate a plan view and a side-view, respectively, of an end effector for handling a thin wafer or substrate supported by a substrate carrier, in accordance with an embodiment of the present invention.

Figures 10A, 10B:
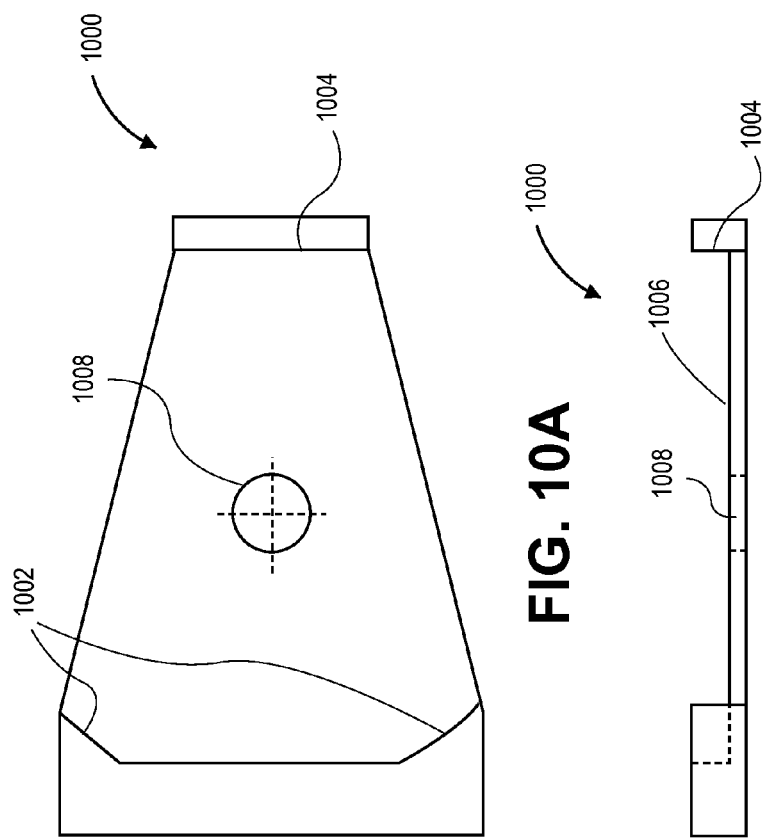
FIGS. 10A and 10B illustrate a plan view and a side-view, respectively, of an end effector for handling a thin wafer or substrate supported by a substrate carrier, in accordance with an embodiment of the present invention.

Referring to FIGS. 10A and 10B, a end effector 1000 (e.g., a robot blade) for handling a substrate carrier includes support edges 1002 for X-Y directional support, support edge 1004 for X directional support, and support surface 1006 for Z directional support. A calibration or centering ring 1008 is also included. FIGS. 10C and 10D illustrate a plan view and a side-view, respectively, of an end effector (left side) supporting a substrate carrier (right side), in accordance with an embodiment of the present invention.

Referring to FIGS. 10C and 10D, end effector 1000 is depicted supporting a substrate carrier such as substrate carrier 900 described above. In an embodiment, the robotic end effector 1000 supports the film frame assembly (e.g., substrate carrier 900) during transfer to and from an etch reactor under sub-atmospheric pressure (vacuum). The end effector 1000 includes features to support the substrate carrier in the X-Y-Z axis with gravity-assist. The end effector 1000 also includes a feature to calibrate and center the end effector with respect to circular features of a processing tool (e.g., an etch cathode center, or a center of a circular silicon wafer).

A capture ring may be used to accommodate a substrate carrier during an etch portion of a singulation process. For example, FIGS. 11A and 11B illustrate a plan view and a side-view, respectively, of a capture ring for handling a thin wafer or substrate supported by a substrate carrier, in accordance with an embodiment of the present invention.

Figure 11A:
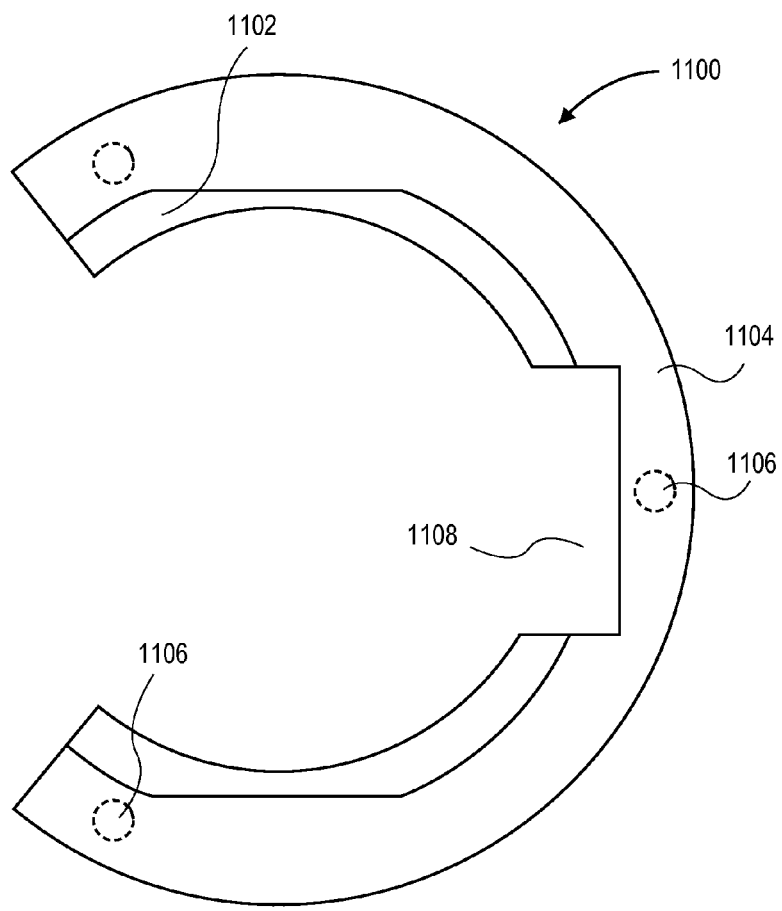
FIGS. 11A and 11B illustrate a plan view and a side-view, respectively, of a capture ring for handling a thin wafer or substrate supported by a substrate carrier, in accordance with an embodiment of the present invention.
Figure 11B:
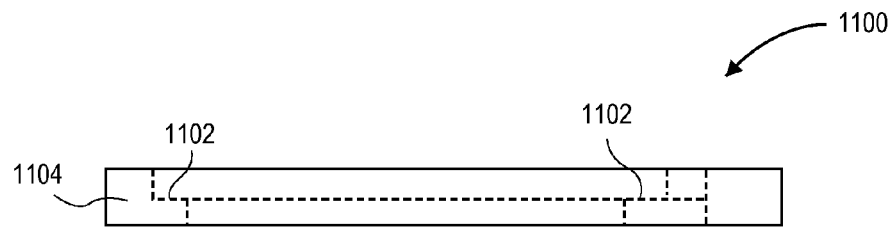
Figure 11C:
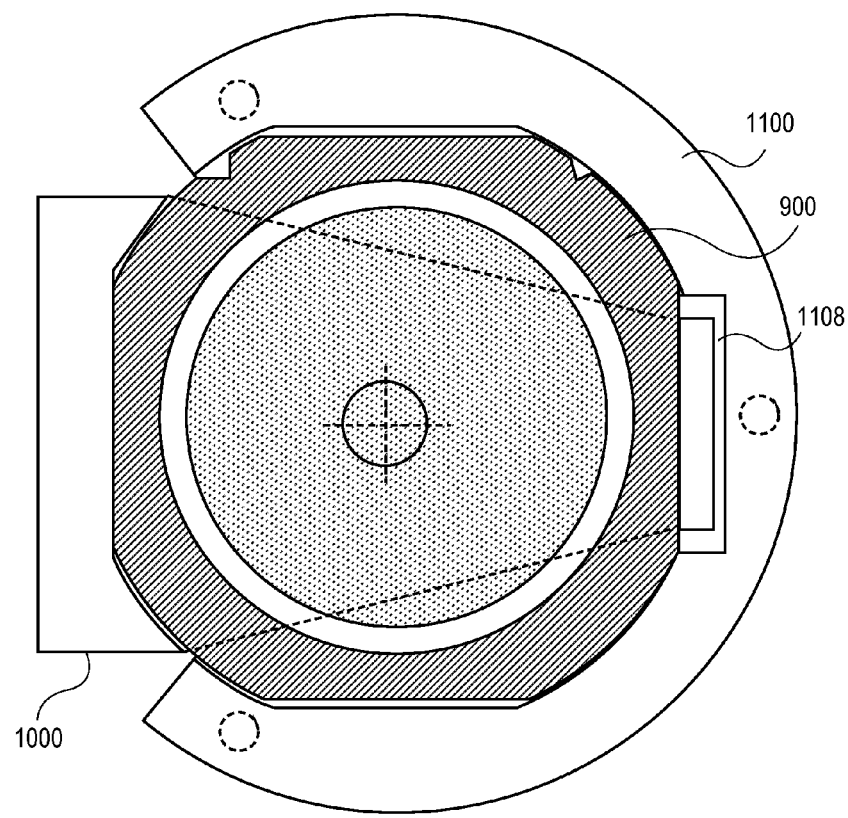
FIGS. 11C and 11D illustrate a plan view and a side-view, respectively, of a capture ring accommodating an end effector supporting a substrate carrier, in accordance with an embodiment of the present invention.
Figure 11D:
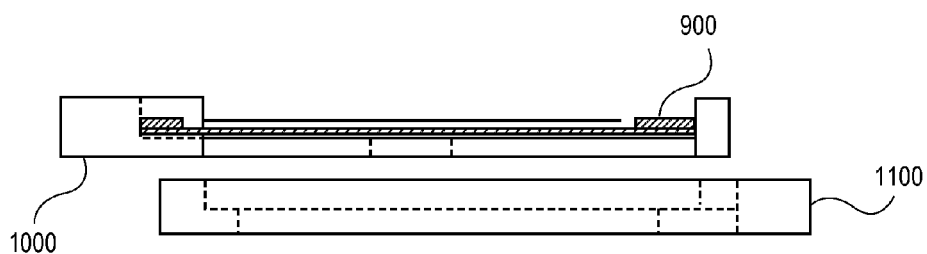

Referring to FIGS. 11A and 11B, a capture ring 1100 includes a receiving area 1102 for supporting a substrate carrier. A frame 1104 surrounds the receiving area 1102. The frame may include features suitable for transfer processes, such pin receiving features 1106 (e.g., partial slots as opposed to holes) and slot 1108. The capture ring may be sized for transferring a substrate carrier from a robotic end effector to a plasma reactor. For example, FIGS. 11C and 11D illustrate a plan view and a side-view, respectively, of a capture ring accommodating an end effector supporting a substrate carrier, in accordance with an embodiment of the present invention. Referring to FIGS. 11C and 11D, the capture ring 1100 accommodates the end effector 1000 supporting a substrate carrier 900 in the slot 1108.

The capture ring 1100 may, in an embodiment, support the film frame or substrate carrier on outer edges of the substrate carrier and transfer the substrate carrier off of a robotic end effector and onto an etch cathode. Thus, the capture ring 1100 is shaped to handle the film frame or substrate carrier from the backside and outer edges without interfering with a robotic end effector. In one embodiment, the approach provides little to no mechanical stress to a supported thin wafer or substrate. As an example, FIG. 11E illustrates a motion sequence for hand-off between an end effector and a capture ring inside an etch chamber, in accordance with an embodiment of the present invention.

Figure 11E:
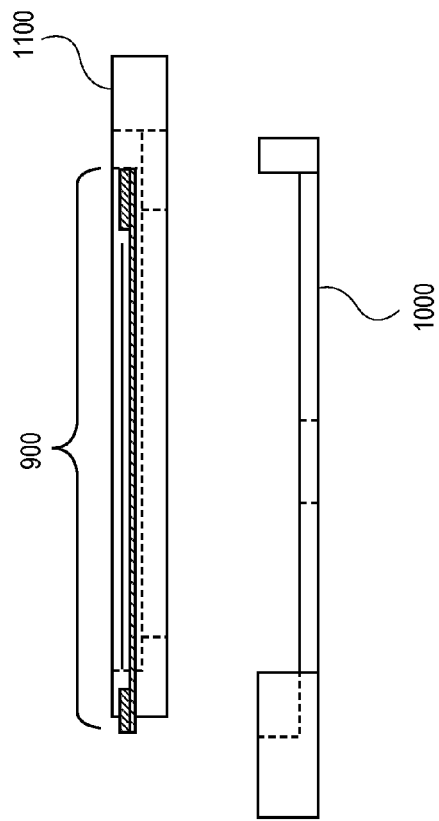
FIGS. 11E and 11F illustrate a motion sequence for hand-off between an end effector and a capture ring inside an etch chamber, in accordance with an embodiment of the present invention.
Figure 11F:
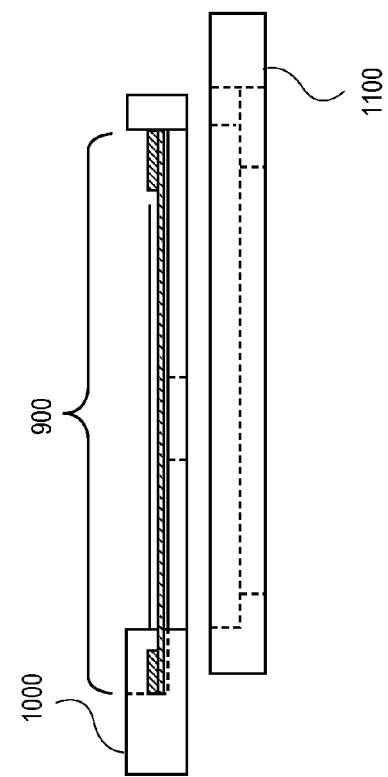

Referring to FIG. 11E, position 1 illustrates a loaded end effector 1000 supporting a substrate carrier 900 and positioned over an empty capture ring 1100. Position 2 illustrates an empty end effector 1000 positioned below a loaded capture ring 1100 now supporting the substrate carrier 900. Thus, in an embodiment, transfer of the substrate carrier 900 from the end effector 1000 to the capture ring 1100 is performed by moving the capture ring 1100 from a position below the end effector 1000 (e.g., position 1) to a position above the end effector 1000 (e.g., position 2).

An etch cathode may be sized to accommodate a substrate carrier during an etch portion of a singulation process. For example, FIGS. 12A and 12B illustrate a plan view and a side-view, respectively, of an etch cathode compatible for use with a substrate carrier, in accordance with an embodiment of the present invention.

Figure 12A:
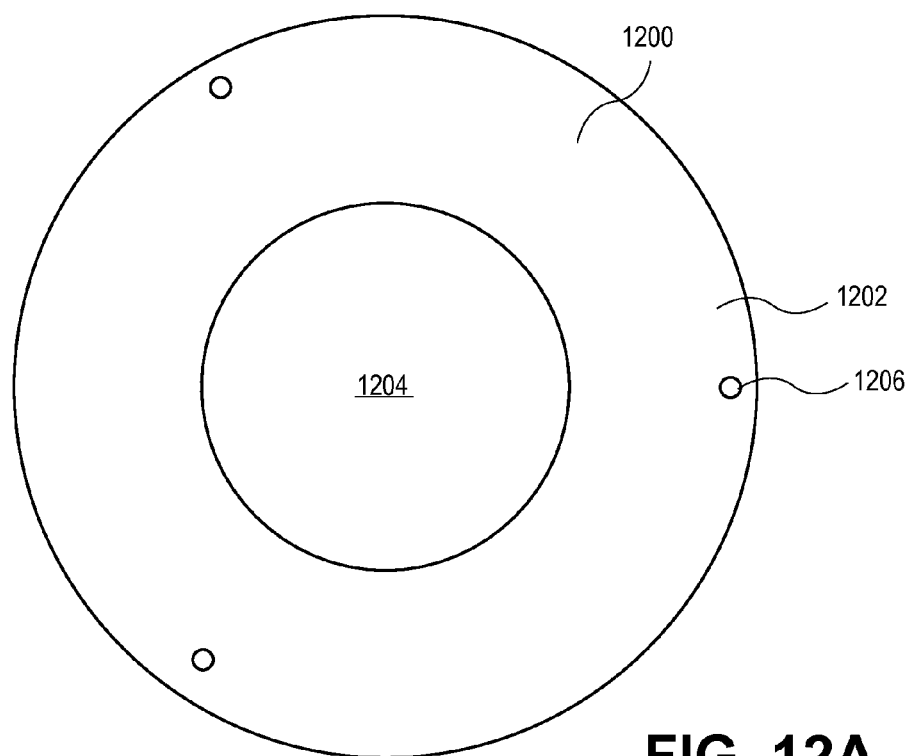
FIGS. 12A and 12B illustrate a plan view and a side-view, respectively, of an etch cathode compatible for use with a substrate carrier, in accordance with an embodiment of the present invention.
Figure 12B:
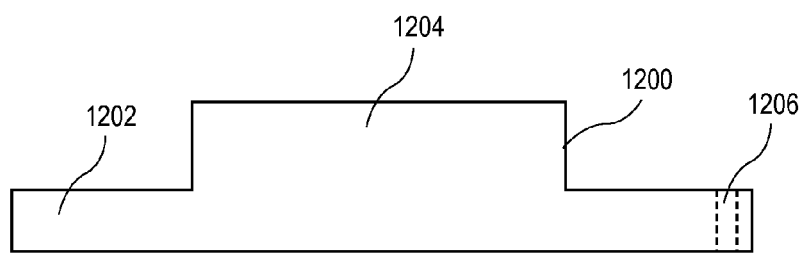

Referring to FIGS. 12A and 12B, an etch cathode 1200 is composed of a unitary body including an outer thinner ring portion 1202 and an inner thicker cylindrical portion 1204. The etch cathode 1200 may include features suitable for transfer processes, such pin receiving features 1206 (e.g., holes as opposed to partial slots). In one embodiment, the etch cathode 1200 is thermally controlled. In one embodiment, the etch cathode 1200 is both electrically and thermally conductive and includes an etch resistant dielectric coating.

Figure 12C:
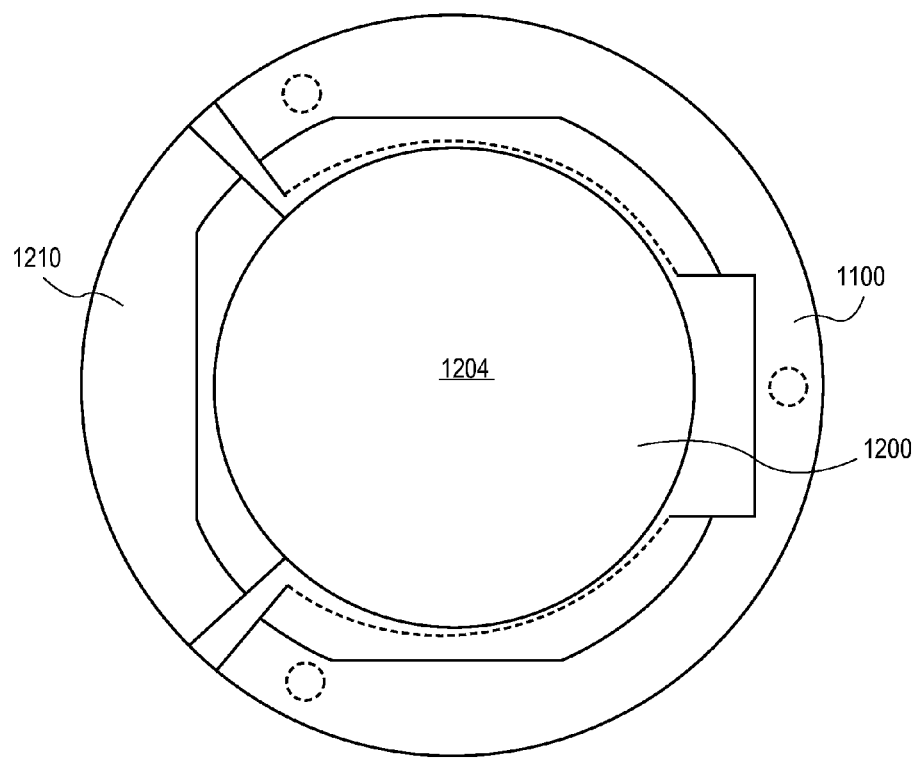
FIGS. 12C and 12D illustrate a plan view and a side-view, respectively, of an assembled etch cathode, cover ring, and capture ring, in accordance with an embodiment of the present invention.
Figure 12D:
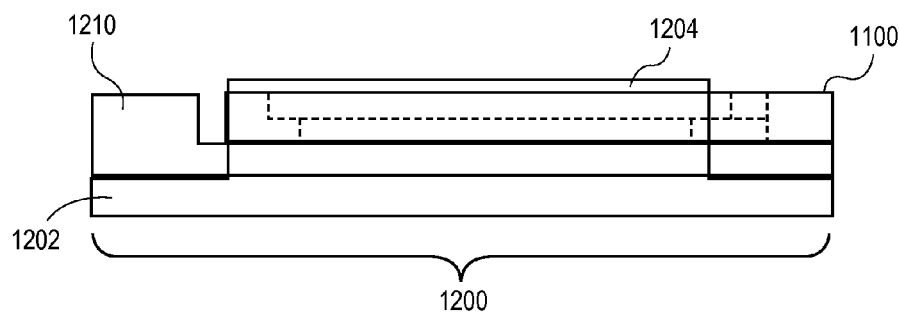

A cover ring may be coupled with the etch cathode 1200 to support a capture ring and to space the capture ring from the outer thinner ring portion 1202 of the etch cathode 1200. For example, FIGS. 12C and 12D illustrate a plan view and a side-view, respectively, of an assembled etch cathode, cover ring, and capture ring, in accordance with an embodiment of the present invention. Referring to FIGS. 12C and 12D, a capture ring 1100 is centered to partially surround the inner thicker cylindrical portion 1204 of the etch cathode 1200. A cover ring 1210 covers the outer thinner ring portion 1202 of the etch cathode 1200 and spaces the capture ring 1100 from the outer thinner ring portion 1202 of the etch cathode 1200.

Figure 12E:
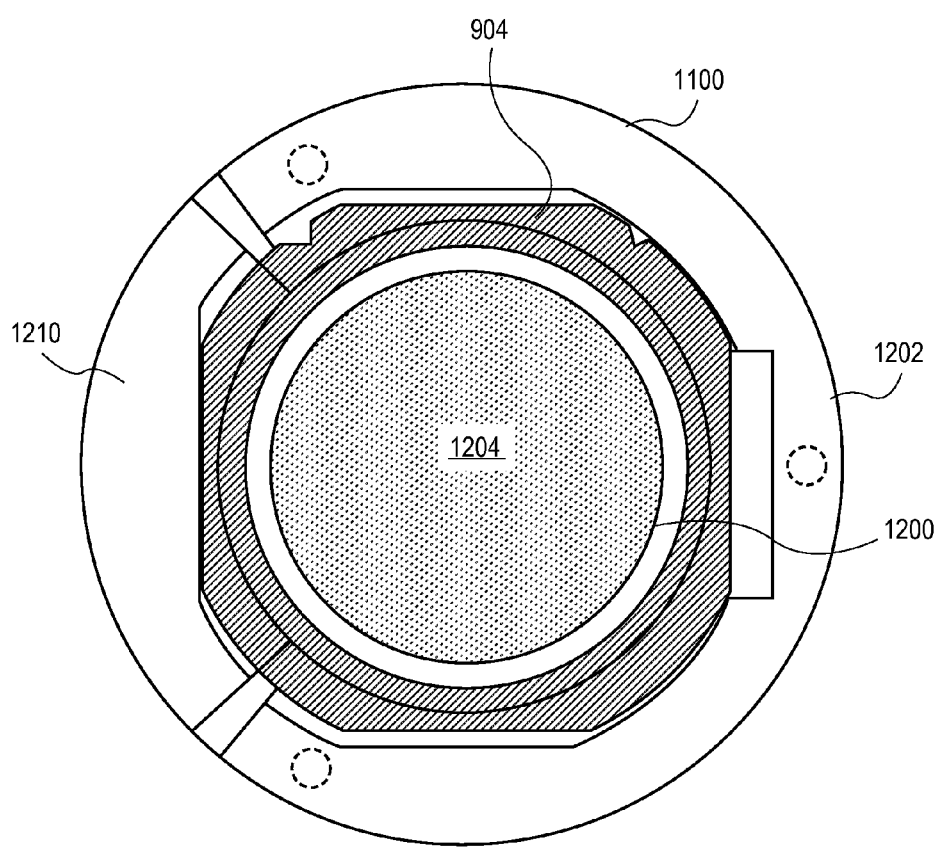
FIG. 12E illustrates a plan view of an assembled etch cathode, cover ring, capture ring, and substrate carrier (frame only), in accordance with an embodiment of the present invention.

FIG. 12E illustrates a plan view of an assembled etch cathode, cover ring, capture ring, and substrate carrier (frame only), in accordance with an embodiment of the present invention. Referring to FIG. 12E, a capture ring 1100 is centered to partially surround the inner thicker cylindrical portion 1204 of the etch cathode 1200. A cover ring 1210 covers the outer thinner ring portion 1202 of the etch cathode 1200 and spaces the capture ring 1100 from the outer thinner ring portion 1202 of the etch cathode 1200. A substrate carrier (only carrier frame 904 shown for clarity) is centered with the inner thicker cylindrical portion 1204 of the etch cathode 1200. Thus, in an embodiment, the etch electrode 1200 is an apparatus suitable to support a substrate carrier during plasma processing. In one embodiment, the substrate carrier is supported by an inner thicker cylindrical portion of the etch electrode. In one embodiment, the etch electrode is configured to allow RF and thermal coupling with the substrate carrier to enable plasma etching. However, in an embodiment, the etch electrode only contacts a backing tape portion of a substrate carrier and not the frame of the substrate carrier, consistent with the assembly depicted in FIG. 12E.

A protective plate may be used to protect a portion of a substrate carrier during an etch portion of a singulation process. For example, FIGS. 13A and 13B illustrate a plan view and a side-view, respectively, of a protective plate for protecting a substrate carrier supporting a thin wafer or substrate, in accordance with an embodiment of the present invention.

Figure 13A:
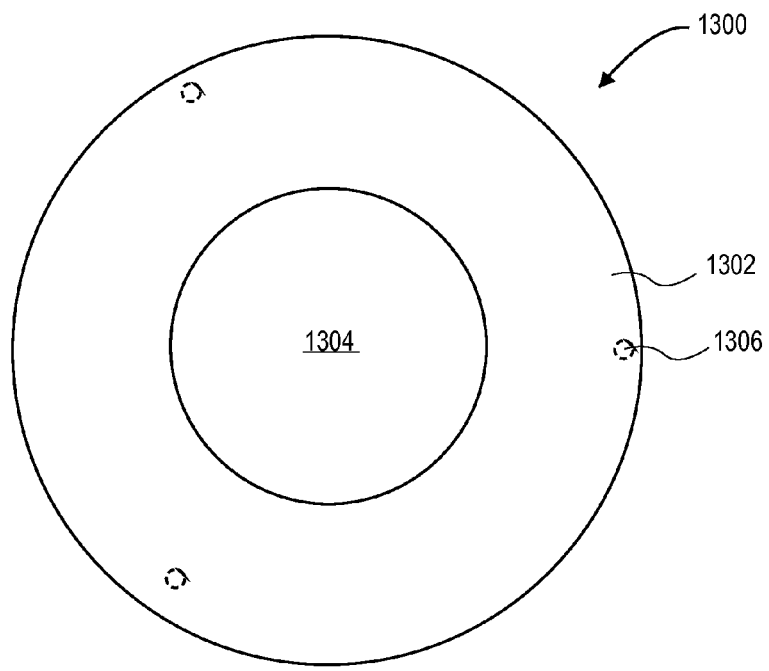
FIGS. 13A and 13B illustrate a plan view and a side-view, respectively, of a protective plate for protecting a substrate carrier supporting a thin wafer or substrate, in accordance with an embodiment of the present invention.
Figure 13B:
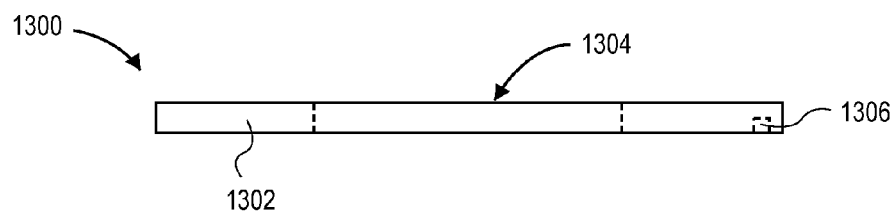

Referring to FIGS. 13A and 13B, a protective plate 1300 is shaped to protect a portion or region of a substrate carrier, such as the frame portion of a substrate carrier. In one embodiment, the protective plate 1300 is an annular ring 1302 with a central aperture 1304. The annular ring 1302 may include features suitable for transfer processes, such pin receiving features 1306 (e.g., partial slots as opposed to holes). In one embodiment, the protective plate 1300 is used to cover a frame portion of a substrate carrier, while exposing the backing tape region (e.g., the region supporting a wafer or substrate) for the duration of an etch process. In a specific such embodiment, the protective plate covers the frame of a substrate carrier and also covers the backing tape or film of the substrate carrier up to the edge of a thin wafer or substrate during plasma etching to prevent etch attack on the exposed portions of the substrate carrier not covered by the supported wafer or substrate.

Figure 13C:
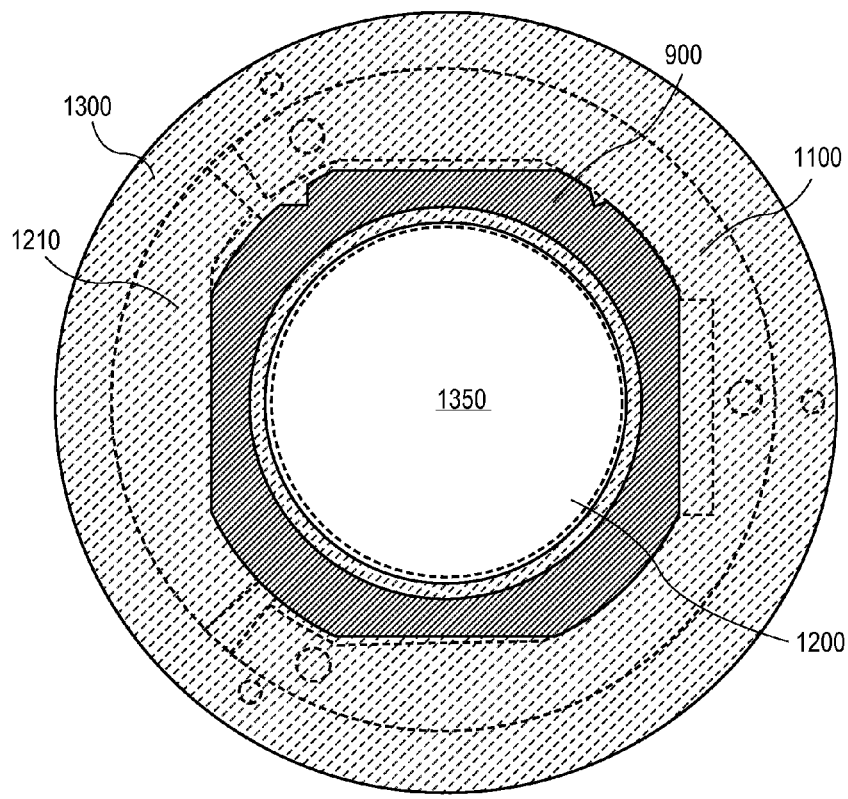
FIGS. 13C and 13D illustrate a plan view and a side view, respectively, of an assembled etch cathode, cover ring, capture ring, substrate carrier, and protective plate, in accordance with an embodiment of the present invention.
Figure 13D:
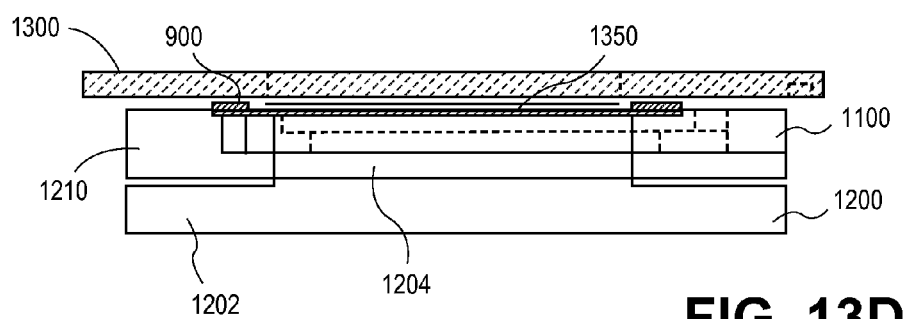

FIGS. 13C and 13D illustrate a plan view and a side view, respectively, of an assembled etch cathode, cover ring, capture ring, substrate carrier, and protective plate, in accordance with an embodiment of the present invention. Referring to FIGS. 13C and 13D, a capture ring 1100 is centered to partially surround the inner thicker cylindrical portion 1204 of an etch cathode 1200. A cover ring 1210 covers the outer thinner ring portion 1202 of the etch cathode 1200 and spaces the capture ring 1100 from the outer thinner ring portion 1202 of the etch cathode 1200. A substrate carrier 900 supporting a wafer or substrate 1350 is centered with the inner thicker cylindrical portion 1204 of the etch cathode 1200. Thus, in an embodiment, the etch electrode 1200 is an apparatus suitable to support a substrate carrier during plasma processing. In one embodiment, the substrate carrier 900 is supported by the inner thicker cylindrical portion 1204 of the etch electrode 1200. A protective ring 1300 covers at least a portion of the substrate carrier 900, while exposing the wafer or substrate 1350 for the etching process.

An exemplary embodiment including a protective plate (such as a protective ring) is as follows. A protective plate assembly includes a protective plate, a lift hoop, three or more supporting pins coupled between the lift hoop and the protective plate.

The lift hoop is disposed in a processing volume radially outwards of a supporting assembly. The lift hoop is mounted on shaft in a substantially horizontal orientation. The shaft is driven by an actuator to move the lift hoop vertically in the processing volume. The three or more supporting pins extend upward from the lift hoop and position the protective plate above the supporting assembly. The three or more supporting pins may fixedly attach the protective plate to the lift hoop. The protective plate moves vertically with the lift hoop in the processing volume so that the protective plate can be positioned at a desired distance above a substrate and/or an exterior substrate handling device (such as a substrate carrier) can enter the processing volume between the protective plate and the supporting assembly to transfer the substrate (e.g., a thinned semiconductor wafer).

The three or more supporting pins may be positioned to allow the substrate to be transferred in and out of a processing chamber between the supporting pins. In one embodiment, each of the three or more supporting pins are positioned close to one of a plurality of supporting legs.

In one embodiment, the protective plate is a planar plate in a size greater than a diameter of the supporting assembly and slightly smaller than to the inner dimension of a chamber wall so that the protective plate can block the downward flow of the processing gas or plasma in the processing volume. In one embodiment, the chamber wall is cylindrical and the protective plate may be a circular disk having an outer diameter slightly smaller than an inner diameter of the chamber wall. In one embodiment, the protective plate has an aperture formed near a central region. The protective plate may be positioned substantially parallel to the top surface of the supporting assembly. The aperture may be aligned with a raised portion of an electrostatic chuck. The aperture may provide a restricted path for the processing gas, or active species, that directs the gas downwards toward the raised portion where the substrate is positioned, thus, controlling the plasma-exposure of the substrate or, perhaps most importantly, of a substrate carrier.

The shape of the aperture may be substantially similar to the shape of the substrate being processed. For example, the shape of the aperture may be circular, square, rectangular, triangular, oval, circular with a flat, hexagonal, octagonal, or any suitable shape of a processing region on a substrate being processed. In one embodiment, the aperture is slightly smaller than a top surface of the substrate to provide protection to the edge of the substrate. In one embodiment, a distance between the protective plate and a top surface of the raised portion can be adjusted to achieve desired plasma-exposure of the substrate. In another embodiment, the size of the aperture can be adjusted to achieve desired plasma-exposure of the substrate.

Alternately, the distance and the size of the aperture can be adjusted to together to achieve desired plasma-exposure of the substrate. When the size of the aperture is slightly smaller than the size of the substrate, the edge of the substrate may be shielded by the protective plate from any species in the process gas descending from the processing volume above. Likewise, when the size of the aperture is essentially the same size as a substrate but smaller than a supporting substrate carrier, the substrate carrier may be shielded by the protective plate from any species in the process gas descending from the processing volume above. On the other hand, changing of the distance may also change how the protective plate affects the substrate.

In one embodiment, the protective plate is movably positioned below a ion-radical shield and above the supporting assembly. The protective plate may have a plurality of through holes to accommodate the plurality of supporting legs that are supporting a flat plate of the ion-radical shield.

During processing, a plasma is usually formed in the processing volume. Species in the plasma, such as radials and ions, pass through the aperture of the protective plate to the substrate. The protective plate protects the supporting substrate carrier from bombardment of the species in the plasma by physically blocking species in the plasma. The protective plate may be formed from materials that are compatible with the processing chemistry. In one embodiment, the protective plate is formed from quartz or ceramics, such as alumina, yttria (yttrium oxide), and K140 (a proprietary material available from Kyocera), among others. In one embodiment, the protective plate (and possibly other components described herein) is composed of a coated metal such as, but not limited to, anodized aluminum or plasma spray coated alumina on aluminum. In a specific such embodiment, the inclusion of a coated metal facilitates electrical energizing of the protective plate (and/or other components described herein that may also be fabricated from a coated metal).

In an aspect of the present invention, an etch reactor is configured to accommodate etching of a thin wafer or substrate supported by a substrate carrier. For example, FIG. 14 illustrates a cross-sectional view of an etch reactor, in accordance with an embodiment of the present invention.

Figure 14:
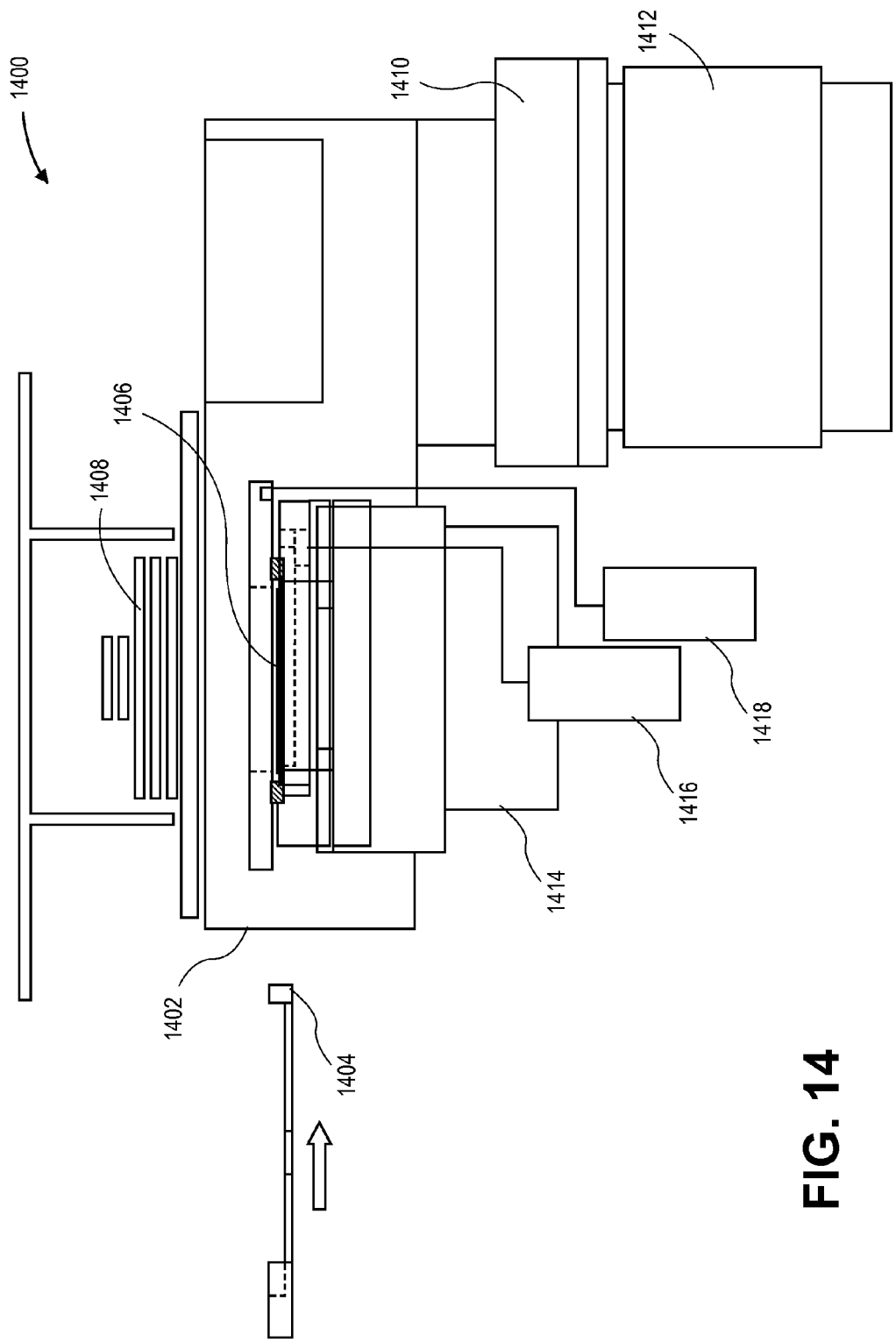
FIG. 14 illustrates a cross-sectional view of an etch reactor, in accordance with an embodiment of the present invention.

Referring to FIG. 14, an etch reactor 1400 includes a chamber 1402. An end effector 1404 is included for transferring a substrate carrier 1406 to and from chamber 1402. An inductively coupled plasma (ICP) source 1408 is positioned above the chamber 1402. The chamber 1402 is further equipped with a throttle valve 1410 and a turbo molecular pump 1412. The etch reactor 1400 also includes a cathode assembly 1414 (e.g., an assembly including an etch cathode such as etch cathode 1300), a capture ring actuator 1416 (e.g., for a capture ring such as capture ring 1100), and a protective plate or ring actuator 1418 (e.g., for protective plate 1300).

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 800 described in association with FIG. 8 or with etch chamber 1400 described in association with FIG. 14. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 15:
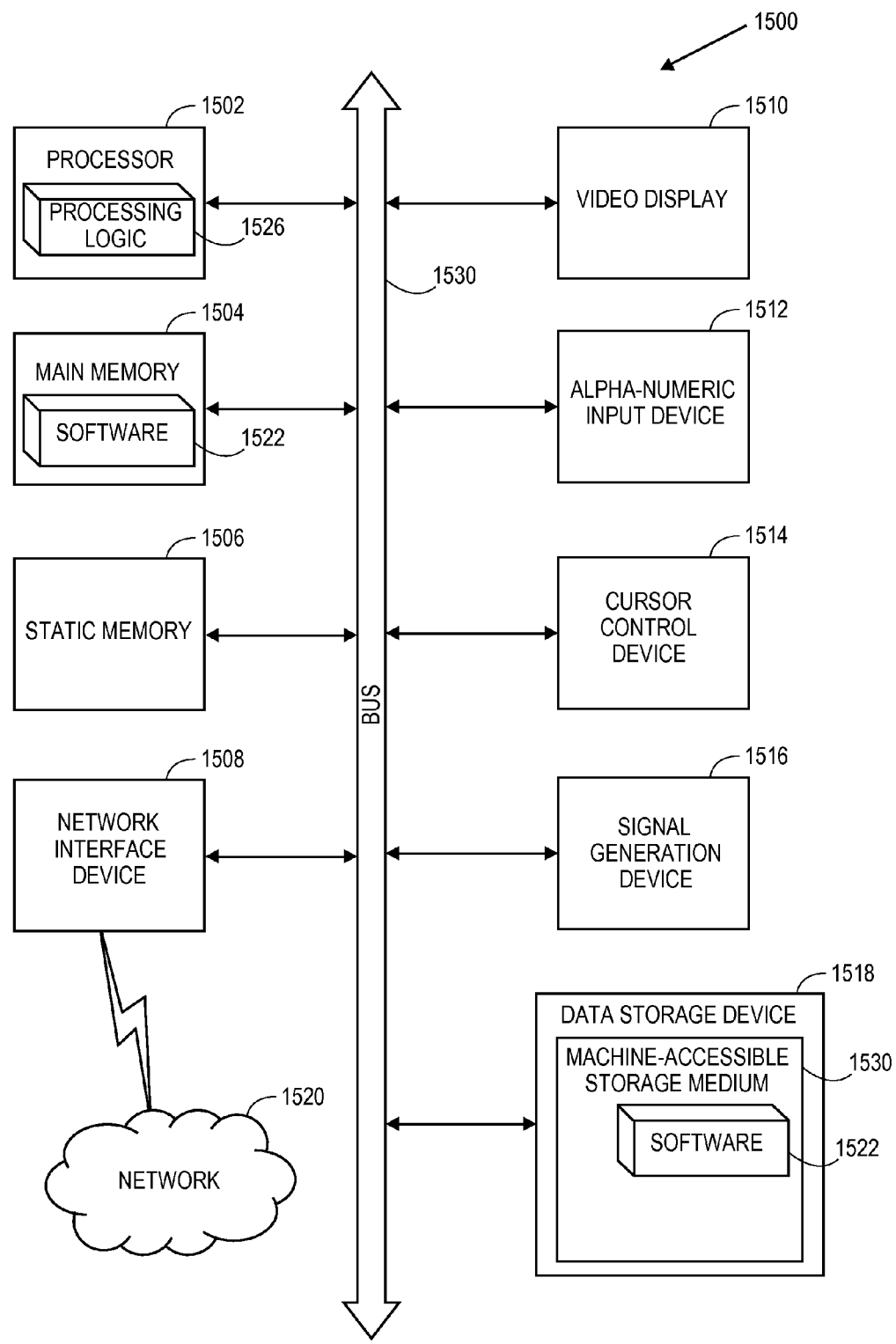
FIG. 15 illustrates a block diagram of an exemplary computer system, in accordance with an embodiment of the present invention.

FIG. 15 illustrates a diagrammatic representation of a machine in the exemplary form of a computer system 1500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1500 includes a processor 1502, a main memory 1504 (e.g., read-only memory (ROM), flash memory, dynamic random access memory (DRAM) such as synchronous DRAM (SDRAM) or Rambus DRAM (RDRAM), etc.), a static memory 1506 (e.g., flash memory, static random access memory (SRAM), etc.), and a secondary memory 1518 (e.g., a data storage device), which communicate with each other via a bus 1530.

Processor 1502 represents one or more general-purpose processing devices such as a microprocessor, central processing unit, or the like. More particularly, the processor 1502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1502 may also be one or more special-purpose processing devices such as an application specific integrated circuit (ASIC), a field programmable gate array (FPGA), a digital signal processor (DSP), network processor, or the like. Processor 1502 is configured to execute the processing logic 1526 for performing the operations described herein.

The computer system 1500 may further include a network interface device 1508. The computer system 1500 also may include a video display unit 1510 (e.g., a liquid crystal display (LCD), a light emitting diode display (LED), or a cathode ray tube (CRT)), an alphanumeric input device 1512 (e.g., a keyboard), a cursor control device 1514 (e.g., a mouse), and a signal generation device 1516 (e.g., a speaker).

The secondary memory 1518 may include a machine-accessible storage medium (or more specifically a computer-readable storage medium) 1531 on which is stored one or more sets of instructions (e.g., software 1522) embodying any one or more of the methodologies or functions described herein. The software 1522 may also reside, completely or at least partially, within the main memory 1304 and/or within the processor 1502 during execution thereof by the computer system 1500, the main memory 1504 and the processor 1502 also constituting machine-readable storage media. The software 1522 may further be transmitted or received over a network 1520 via the network interface device 1508.

While the machine-accessible storage medium 1531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The semiconductor wafer is supported by a substrate carrier. The mask is then patterned with a laser scribing process to provide a patterned mask with gaps, exposing regions of the semiconductor wafer between the integrated circuits. The semiconductor wafer is then etched through the gaps in the patterned mask to singulate the integrated circuits while supported by the substrate carrier.

Thus, methods of dicing semiconductor wafers, each wafer having a plurality of integrated circuits, have been disclosed. In accordance with an embodiment of the present invention, a method includes forming a mask above the semiconductor wafer, the mask including a layer covering and protecting the integrated circuits, and the semiconductor wafer supported by a substrate carrier. The method also includes patterning the mask with a laser scribing process to provide a patterned mask with gaps, exposing regions of the semiconductor wafer between the integrated circuits. The method also includes etching, while supported by the substrate carrier, the semiconductor wafer through the gaps in the patterned mask to singulate the integrated circuits. In one embodiment, the method further includes, prior to the etching, covering a portion of the substrate carrier with a protective plate, the protective plate leaving exposed at least a portion of the semiconductor wafer. In one embodiment, the semiconductor wafer has a thickness of approximately 100 microns or less.

What is claimed is:

1. A method of dicing a semiconductor wafer comprising a plurality of integrated circuits, the method comprising:
    forming a mask above the semiconductor wafer, the mask comprising a layer covering and protecting the integrated circuits, and the semiconductor wafer supported by a substrate carrier;
    patterning the mask with a laser scribing process to provide a patterned mask with gaps, exposing regions of the semiconductor wafer between the integrated circuits; and, subsequently,
    covering a portion of the substrate carrier with a protective plate, the protective plate leaving exposed at least a portion of the semiconductor wafer; and, subsequently,
    etching, while supported by the substrate carrier, the semiconductor wafer through the gaps in the patterned mask to singulate the integrated circuits.

2. The method of claim 1, wherein the substrate carrier comprises a layer of backing tape surrounded by a tape ring.

3. The method of claim 1, wherein the semiconductor wafer is disposed on a die attach film disposed on the substrate carrier, the method further comprising:
    patterning, while disposed on the substrate carrier, the die attach film.

4. The method of claim 1, wherein patterning the mask with the laser scribing process comprises patterning the mask with a femtosecond-based laser scribing process.

5. The method of claim 1, wherein the semiconductor wafer has a thickness of approximately 100 microns or less.

6. A method of dicing a semiconductor wafer comprising a front surface having a plurality of integrated circuits thereon and having a back surface opposite the front surface, the method comprising:
    forming a mask on the front surface of the semiconductor wafer, the mask comprising a layer covering and protecting the integrated circuits, and the semiconductor wafer supported by a substrate carrier;
    patterning the mask and a portion of the semiconductor wafer with a laser scribing process to provide a patterned mask, and to form trenches partially into but not through the semiconductor wafer between the integrated circuits;

covering a portion of the substrate carrier with a protective plate, the protective plate leaving exposed at least a portion of the patterned mask; and subsequent to covering the portion of the substrate carrier with the protective plate, etching, while supported by the substrate carrier, the semiconductor wafer through the trenches to singulate the integrated circuits.

7. The method of claim 6, wherein the covering with the protective plate is performed prior to the etching but subsequent to the laser scribing process.

8. The method of claim 6, wherein the covering with the protective plate is performed prior to both the laser scribing process and the etching.

9. The method of claim 6, wherein the substrate carrier comprises a layer of backing tape surrounded by a tape ring.

10. The method of claim 6, wherein the semiconductor wafer is disposed on a die attach film disposed on the substrate carrier, the method further comprising:

patterning, while disposed on the substrate carrier, the die attach film.

11. The method of claim 6, wherein patterning the mask with the laser scribing process comprises patterning the mask with a femtosecond-based laser scribing process.

12. The method of claim 6, wherein the semiconductor wafer has a thickness of approximately 100 microns or less.

13. A method of dicing a semiconductor wafer comprising a plurality of integrated circuits, the method comprising:

forming a mask above the semiconductor wafer, the mask comprising a layer covering and protecting the integrated circuits, and the semiconductor wafer supported by a substrate carrier;

patterning the mask with a laser scribing process to provide a patterned mask having a top surface with gaps, exposing regions of the semiconductor wafer between the integrated circuits;

covering a portion of the substrate carrier with a protective plate, the protective plate leaving exposed at least a portion of the top surface of the patterned mask and at least a portion of the exposed regions of the semiconductor wafer between the integrated circuits; and, subsequently, etching, while supported by the substrate carrier, the semiconductor wafer through the gaps in the patterned mask to singulate the integrated circuits.

14. The method of claim 13, wherein the covering with the protective plate is performed prior to the etching but subsequent to the laser scribing process.

15. The method of claim 13, wherein the covering with the protective plate is performed prior to both the laser scribing process and the etching.

16. The method of claim 13, wherein the substrate carrier comprises a layer of backing tape surrounded by a tape ring.

17. The method of claim 13, wherein the semiconductor wafer is disposed on a die attach film disposed on the substrate carrier, the method further comprising:

patterning, while disposed on the substrate carrier, the die attach film.

18. The method of claim 13, wherein patterning the mask with the laser scribing process comprises patterning the mask with a femtosecond-based laser scribing process.

19. The method of claim 13, wherein the semiconductor wafer has a thickness of approximately 100 microns or less.

* * * * *